(12) United States Patent
Balasubramanian

(10) Patent No.: US 9,264,023 B2
(45) Date of Patent: Feb. 16, 2016

(54) SCANNABLE FLOP WITH A SINGLE STORAGE ELEMENT

(71) Applicant: Cavium, Inc., San Jose, CA (US)

(72) Inventor: Suresh Balasubramanian, Shrewsbury, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 14/200,939

(22) Filed: Mar. 7, 2014

(65) Prior Publication Data

US 2015/0061740 A1  Mar. 5, 2015

Related U.S. Application Data

(60) Provisional application No. 61/872,388, filed on Aug. 30, 2013.

(51) Int. Cl.
*H03K 3/289* (2006.01)
*H03K 3/3562* (2006.01)
*G01R 31/3185* (2006.01)

(52) U.S. Cl.
CPC .... *H03K 3/35625* (2013.01); *G01R 31/318541* (2013.01)

(58) Field of Classification Search
USPC ......... 327/202, 203, 208, 210–212, 214, 215, 327/218, 219, 225
See application file for complete search history.

(56) References Cited

U.S. PATENT DOCUMENTS

| | | | |
|---|---|---|---|
| 6,181,179 B1 * | 1/2001 | Kanba | 327/202 |
| 7,274,234 B2 | 9/2007 | Branch et al. | |
| 7,345,518 B2 | 3/2008 | Branch et al. | |
| 7,375,567 B2 | 5/2008 | Branch et al. | |
| 7,872,513 B2 | 1/2011 | Uchida | |
| 8,352,815 B2 * | 1/2013 | Frederick, Jr. | 327/202 |
| 8,525,565 B2 * | 9/2013 | Rahman et al. | 327/202 |
| 9,130,549 B2 | 9/2015 | Balasubramanian et al. | |
| 2002/0029355 A1 | 3/2002 | Sakamoto et al. | |
| 2006/0061407 A1 | 3/2006 | Biswurm et al. | |
| 2008/0115025 A1 * | 5/2008 | Frederick | 714/732 |
| 2013/0169332 A1 * | 7/2013 | Rahman et al. | 327/208 |
| 2015/0061741 A1 | 3/2015 | Balasubramanian et al. | |

\* cited by examiner

*Primary Examiner* — Long Nguyen
(74) *Attorney, Agent, or Firm* — Hamilton, Brook, Smith & Reynolds, P.C.

(57) ABSTRACT

In an embodiment, a flip flop circuit includes a master latch and a slave latch. The master latch comprises a storage element and at least two legs, including a data leg and at least one scan leg. The first node of the storage element may be driven by the data leg. The opposite node of the storage element may be driven by at least one of the scan legs. The slave latch may be coupled to the master latch.

9 Claims, 5 Drawing Sheets

SCANNABLE FLOP WITH A SINGLE STORAGE ELEMENT

RELATED APPLICATION

This application claims the benefit of U.S. Provisional Application No. 61/872,388, filed on Aug. 30, 2013. The entire teachings of the above application are incorporated herein by reference.

BACKGROUND

The capability to test digital logic inside Integrated Circuits (ICs) is a chief concern of electronic system vendors. Many different forms of circuits are used for products, by commercial and industrial customers, including Integrated Circuits (ICs), electronic circuits, semiconductors, Very Large Scale Integrated Circuits (VLSICs), Application Specific Integrated Circuits (ASICs), circuitry on printed circuit boards (PCBs), nanotechnology circuits, and other types of circuits. With increasing functionality, circuitry is growing more dense and more complex, and testing is becoming an exponentially more difficult task. Scan is a method commonly used for testing circuitry. Types of scan include, but are not limited to, Boundary Scan, Joint Test Action Group (JTAG), or other methods. Using scan, a user has direct access to testing flip-flops (also known as "flip flops" or "flops"), thereby bypassing datapath logic that is used in normal operation.

For a multi-gigahertz processor, speed improvement that saves just half of a gate delay may result in a product frequency speedup of 8 to 10 percent. It would be helpful that such a speed improvement also result in the same, or improved, scan functionality.

SUMMARY

The present approach provides a flip flop circuit that runs at a higher speed (smaller setup time) than existing flip flop circuits while not compromising on scan functionality. In addition to improving setup time and frequency, the present approach reduces area requirements, thereby improving scan coverage and reducing real-estate usage on ICs.

The present approach is directed to a method of reducing setup time and improving performance of a flip flop circuit with multiple multiplexed data inputs. The method selects data through clock logic rather than through data path multiplexer functionality of the circuit. The method requires only one input clock for the circuit and requires only one storage element on a master data path of the circuit, thereby reducing area requirements.

In an embodiment, a flip flop circuit includes a master latch and a slave latch. The master latch comprises a storage element and at least two legs, including a data leg and at least one scan leg. The first node of the storage element may be driven by the data leg. The opposite node of the storage element may be driven by at least one of the scan legs. The slave latch may be coupled to the master latch.

In the flip flop circuit, a slave data input of the slave latch may be connected to the first node of the storage element. Each leg of the flip flop circuit may have a data input that drives an inverter buffer. An output of the inverter buffer may drive a transmission gate, and an output of the transmission gate may drive the storage element.

The storage element may comprise inverter buffers. At least two of the inverter buffers may oppose each other. Each inverter buffer may be enabled by a respective generated clock received from each respective leg. Each inverter buffer may receive data driven from each leg.

The slave latch may comprise a transmission gate that drives a slave storage element. The flip flop circuit may include a single clock input. The slave latch may have a data input that drives an inverter buffer. An output of the inverter buffer may drive a transmission gate that drives a slave storage element that drives an output inverter buffer.

Each leg of the flip flop circuit may comprise a combinatorial logic block with a scan mode input and a clock input. The output of the combinatorial logic block may generate a clock. The generated clock may enable a data output of the leg. The combinatorial logic block of the flip flop circuit may comprise a two-input NOR gate. The generated clock of the flip flop circuit may be inverted for an active low enable input, to enable the data output of each leg.

In another embodiment, the at least one scan leg may comprise a plurality of scan legs. In such an embodiment, the data leg may perform a logical OR on a plurality of scan mode inputs.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
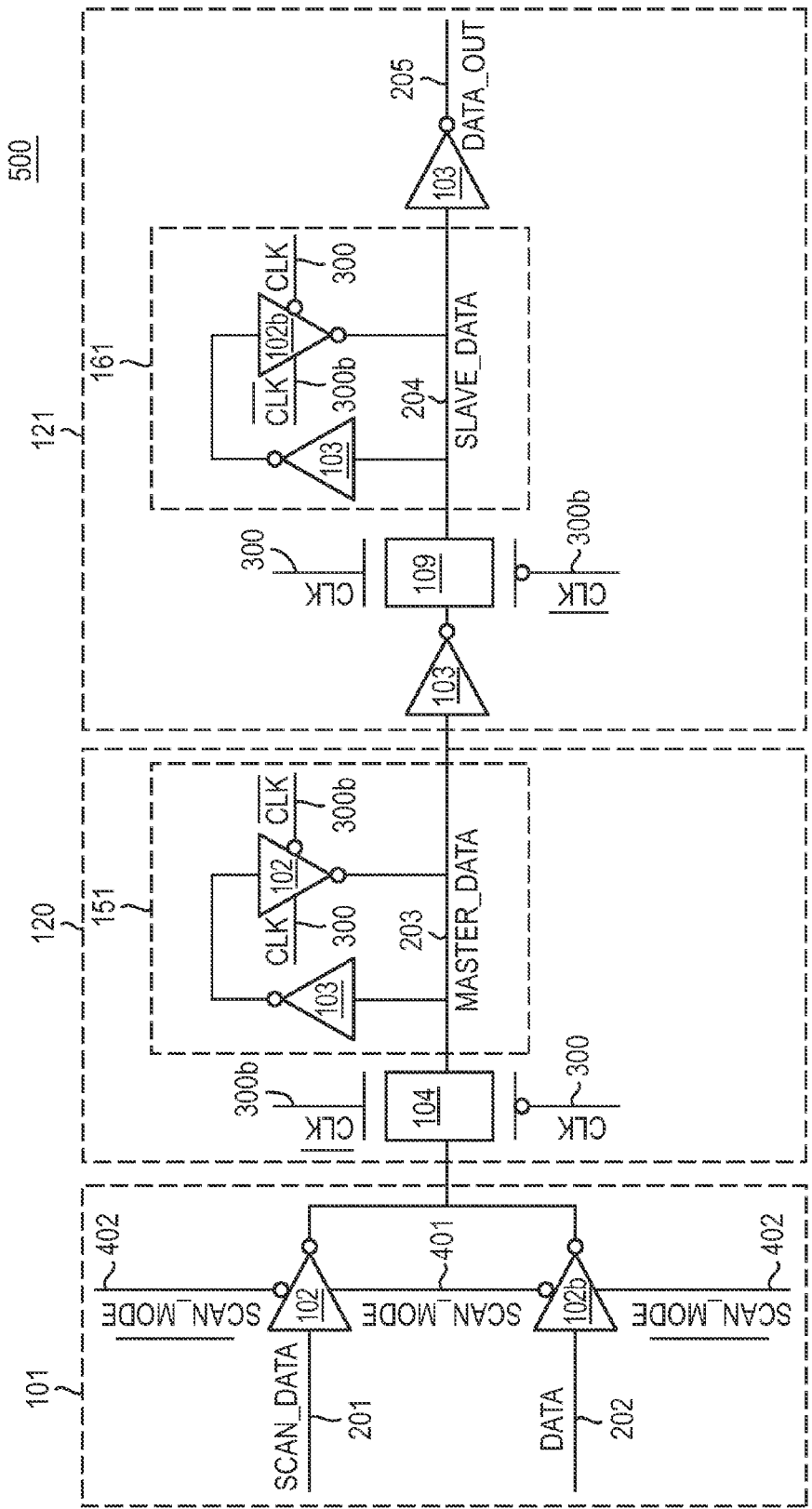
FIG. 1 illustrates a scannable rising edge triggered flip-flop.

One of the fundamental design elements in an IC design is a scannable flip-flop. FIG. 1 illustrates a scannable rising edge triggered flip-flop. Injecting input scan data (i.e., scan intrusion) at the input of the flop is typically done using a multiplexer stage at the input as shown in FIG. 1.

The FIG. 1 flip-flop implementation 500 captures two types of DATA. First, the flip-flop captures DATA 202 on the rising edge of a CLK (clock) 300 if SCAN_MODE (scan mode selection) 401 is in logic state "0." Second, the flip-flop captures SCAN_DATA 201 on the rising edge of CLK (clock) 300 if SCAN_MODE (scan mode selection) 401 is in logic state "1."

FIG. 1 includes a standard 2-to-1 multiplexer 101 formed of an inverter buffer 102 and an inverter buffer with reversed input enable polarity 102b that selects between DATA 202 and SCAN_DATA 201. As shown in FIG. 1, each inverter buffer 102 has an active high enable and an active low enable. For the multiplexer 101, the enables of its inverter buffer 102 and its inverter buffer with reversed input enable polarity 102b take as inputs SCAN_MODE 401 and an inverted version of SCAN_MODE 402.

The input mux configuration shown in FIG. 1 includes a master latch 120 and a slave latch 121. Within the master latch 120, the output data of the 2-to-1 multiplexer is received through a transmission gate 104 that passes data into a master storage element 151 where data is received as MASTER_DATA 203. For the transmission gate 104, the active low enable is tied to the clock, CLK 300, and the active high enable is tied to an inverted version of CLK 300b. As shown in FIG. 1, the master storage element 151 is comprised of an inverter 103 and an opposing inverter buffer 102 that is enabled by CLK 300, and enabled by an inverted version of CLK 300b.

The MASTER_DATA 203 from the master storage element 151 is driven into the slave latch 121 of FIG. 1. Within the slave latch 121, the data is driven through an inverter 103, then driven through a transmission gate 109, a slave storage element 161, and an output inverter 103 to a slave data output, DATA_OUT 205.

In FIG. 1, note that some slave latch 121 elements differ slightly from some master latch 120 elements. The slave transmission gate 109 differs from the master transmission gate 104, in that the slave transmission gate 109 has CLK 300 connected to its active high enable and the inverted version of CLK 300b connected to its active low enable. In addition, the slave storage element 161 which stores data 204, has an inverter buffer with reversed input enable polarity 102b, compared with the inverter buffer 102 of the master storage element 151.

Figure 2:
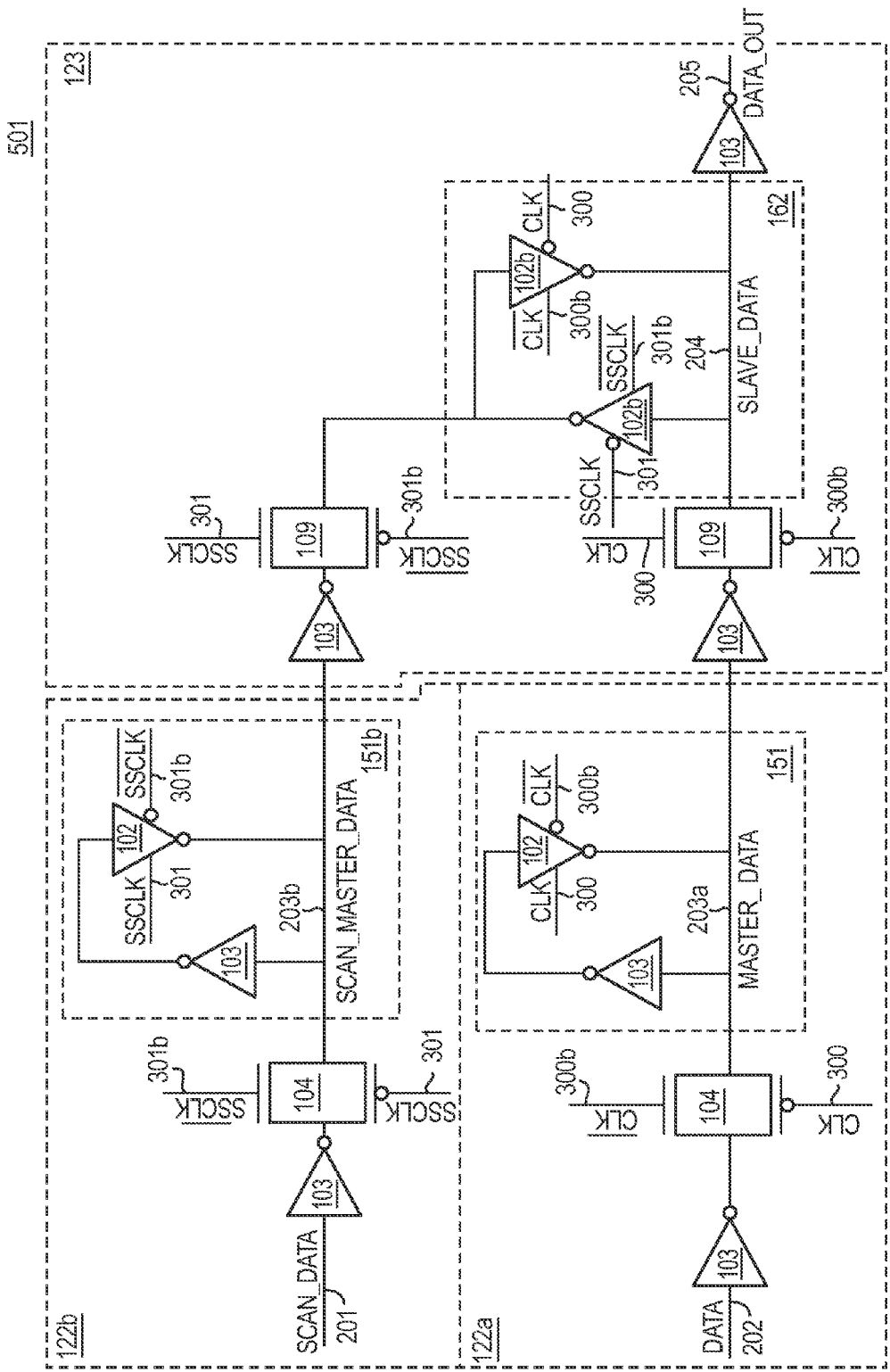
FIG. 2 illustrates another scannable flip-flop.

FIG. 2 illustrates another scannable flip-flop 501. As shown in FIG. 2, in addition to a first master latch 122a for DATA 202, an additional master latch 122b may be used which captures SCAN_DATA 201 on a separate scan clock, SSCLK 301. As shown in FIG. 2, the slave latch 123 merges in data from first latch 203a and data from the second latch 203b.

The multiplexing accomplished by SCAN_MODE 401 in the flip-flop shown in FIG. 1 is achieved implicitly in FIG. 2 through the use of the two clocks SSCLK 301 and CLK 300, and their respective inverted versions (inverted SSCLK 301b and inverted CLK 300b). During scan, SSCLK 301 toggles and CLK 300 is held in a logic "0" state. During normal mode, CLK 300 toggles and SSCLK 301 is held in logic "0" state.

By converting the 2-to-1 multiplexer 101 at the input to a simple inverter 103, the scheme illustrated in FIG. 2 reduces the setup time of the flip flop, resulting in improved datapath speed/frequency. However, the circuit of FIG. 2 achieves a reduction in setup time at a cost of an additional (second) master storage element 151b (in addition to first master storage element 151) and an additional clock, SSCLK 301 (see first clock, CLK 300, and second clock, SSCLK 301, in FIG. 2). In addition, the circuit of FIG. 2 requires a more complex slave storage element 162 which requires two distinct clocks, CLK 300 and SSCLK 301, for each opposing inverter buffer 102b.

Figure 3:
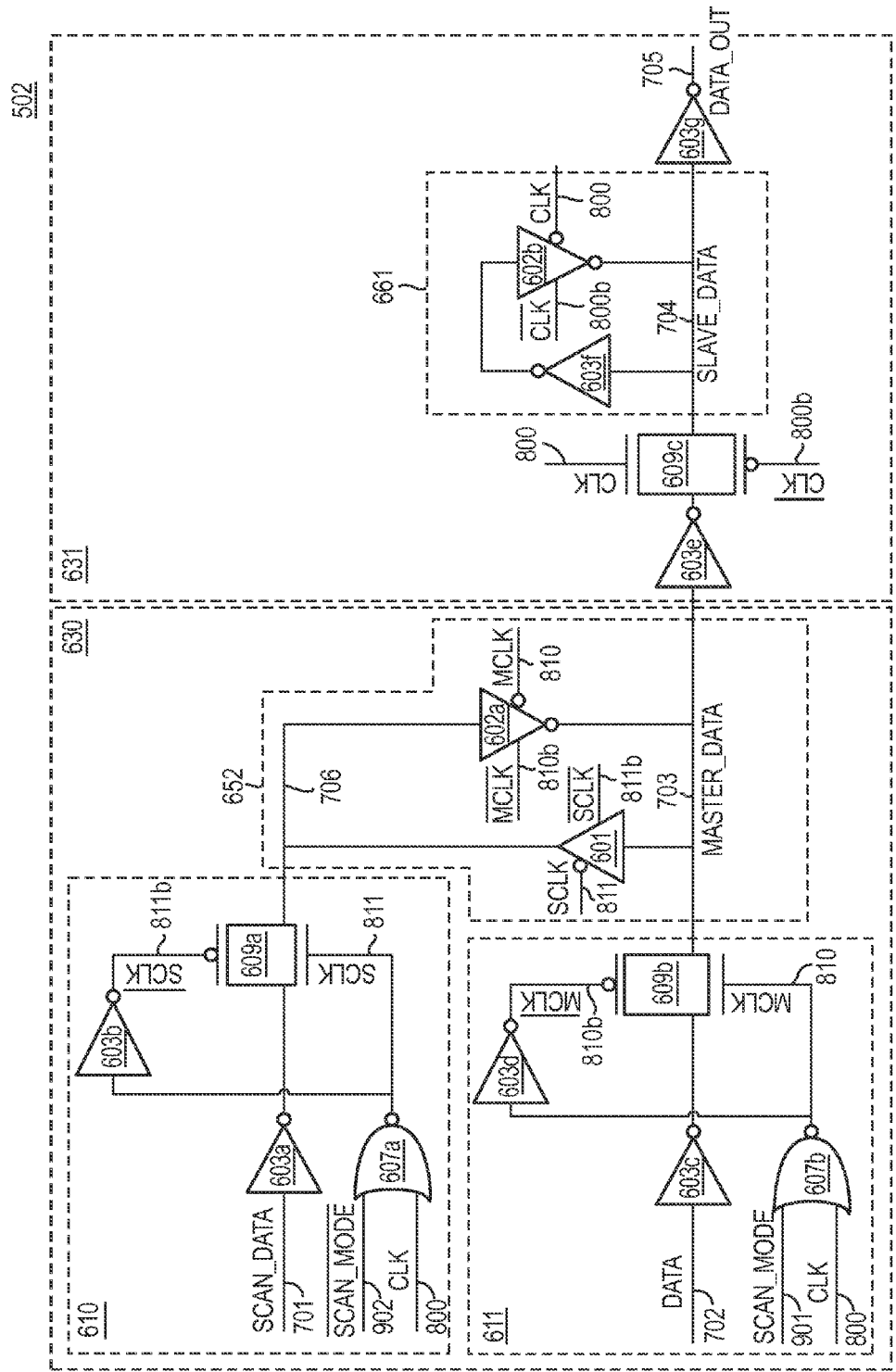
FIG. 3 illustrates an example embodiment of the present invention employing a scannable flip-flop.

FIG. 3 illustrates an example embodiment the present invention employing a scannable flip-flop 502 with no additional storage element. The circuit shown in FIG. 3 achieves reduced setup time without needing an extra storage element, by merging multiplexer functionality with clock control functionality in the master latch 630.

The FIG. 3 circuit 502 includes a master latch 630 and a slave latch 631. In FIG. 3, the master latch 630 is comprised of a data leg 611, a scan leg 610, and a multi-clock master storage element 652. As illustrated in FIG. 3, the data leg receives DATA 702, SCAN_MODE 901, and CLK 800. Correspondingly, the scan leg receives SCAN_DATA 701, an inverted version of SCAN_MODE select 902, and CLK 800. Each leg includes an input inverter (see 603a, 603c in FIG. 3) which drives input data through a transmission gate (see 609a, 609b in FIG. 3). The transmission gate (609a, 609b) of the leg is enabled by a generated clock (see generated clocks, SCLK 811 and MCLK 810, and their corresponding inverted versions 811b, 810b, in FIG. 3) and an inverter (see 603b, 603d in FIG. 3) that outputs inverted clocks (see inverted SCLK 811b and inverted MCLK 810b, in FIG. 3).

As shown in FIG. 3, each leg also includes a combinatorial logic block (see 607a, 607b in FIG. 3) that has an output that produces a generated clock which feeds into the transmission gate enables. As shown in FIG. 3, using each of the combinatorial logic blocks (implemented as NOR logic gates 607a, 607b in FIG. 3), generated clock SCLK 811 and generated clock MCLK 810 are produced. The generated clocks 810, 811, and their inverted versions 810b, 811b, are used to control the master latch.

There is a difference in usage for the clocks between FIG. 2 and FIG. 3. The clock SCLK 811 of FIG. 3 is generated by the circuit 502 based upon the input CLK 800. By contrast, the clock SSCLK 301 of FIG. 2 is an additional clock input to the circuit 501. An additional clock input is neither used nor required in the circuit 502 of FIG. 3.

For the circuit of FIG. 3, when SCAN_MODE 901 is "1," SCLK 811 toggles, MCLK 810 is held at "0," and SCAN_DATA 701 is captured into the flip-flop through the opposing node 706 of the multi-clock master storage element 652. The resulting scan data is stored in the nodes MASTER_DATA 703 and the node SLAVE_DATA 704, on every rising edge of CLK 800. When SCAN_MODE 901 is "0," MCLK 810 toggles, SCLK 811 is held at "0," and DATA 702 is captured into the storage element node 703 and the storage element node 704 on the rising edge of CLK.

The master storage element 652 includes an inverter buffer 602a and an opposing buffer 601. As shown in FIG. 3, the inverter buffer 602a of the master storage element 652 is enabled by generated clock MCLK 810 and the inverted version of MCLK 810b, and the opposing buffer 601 is enabled by generated clock SCLK 811 and the inverted version of SCLK 811b.

As shown in FIG. 3, the MASTER_DATA 703 from the master storage element 652 is driven into the slave latch 631. Within the slave latch 631, the data is driven through an inverter 603e, then driven through a transmission gate 609c that is enabled by CLK 800 and the inverted version of CLK 800b. The transmission gate 609c of the slave latch 631 drives the data through a slave storage element 661, and then through an output inverter 603g to a slave data output, DATA_OUT 705. The slave storage element 661 includes an inverter 603f and an opposing inverter buffer 602b which is enabled by CLK 800 and inverted CLK 800b as illustrated in FIG. 3.

The circuit of FIG. 3 has at least the following advantages over existing approaches. First, the FIG. 3 circuit 502 has no additional storage element compared with the FIG. 2 circuit 501. Therefore, the FIG. 3 circuit 502 requires less area for implementation on an IC. Second, the FIG. 3 circuit 502 has no multiplexer stage at the input, compared with FIG. 1, resulting in reduced setup time and improved performance of the flip flop over the FIG. 1 circuit 500. Third, the FIG. 3 circuit 502 requires no additional clock input as in FIG. 2.

Figures 4, 4A:
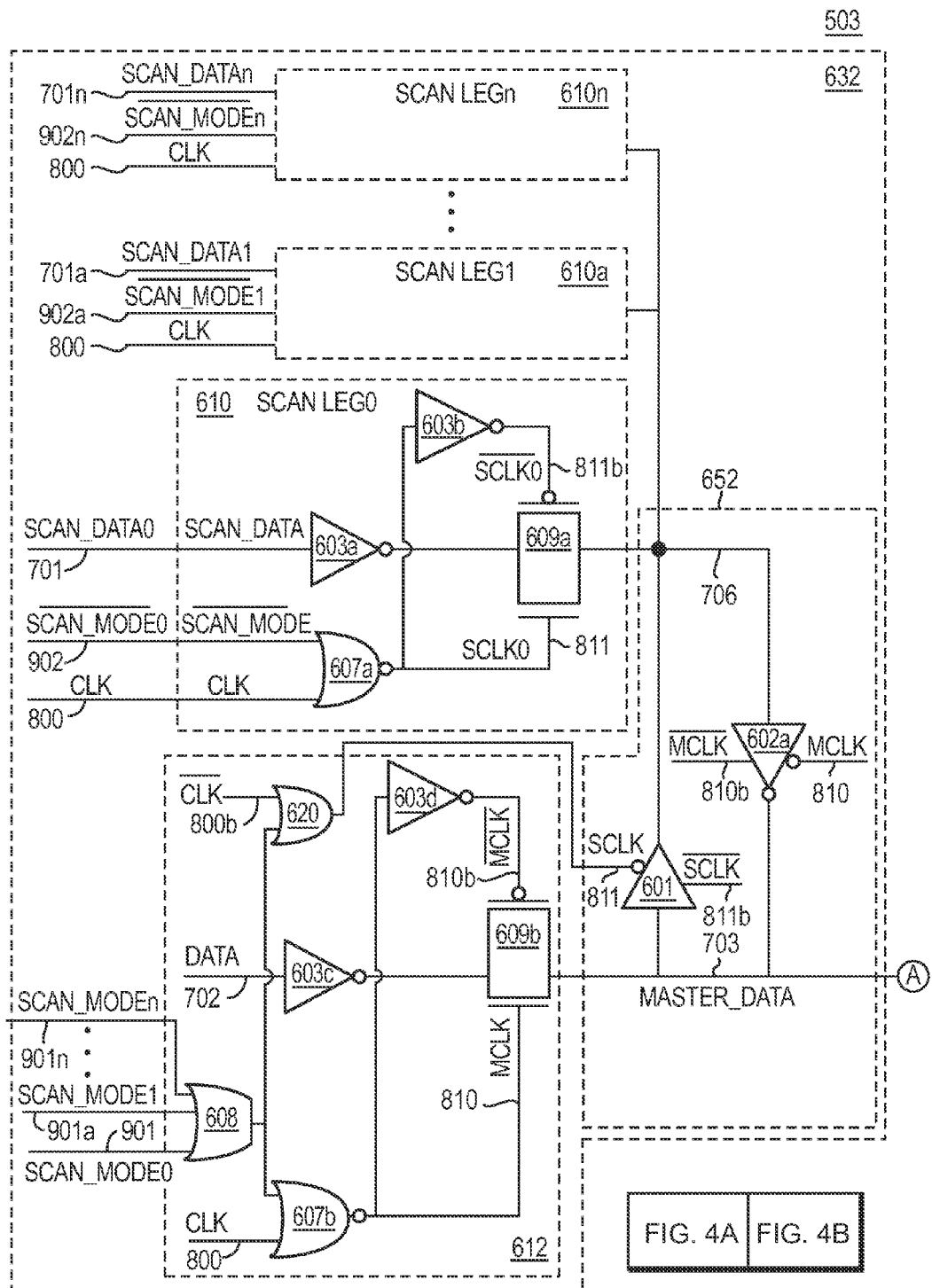
FIG. 4 (collectively, FIGS. 4A-4B) illustrates an example embodiment of the present invention employing a scannable flop with multiple legs and multiple scan inputs.
Figure 4B:
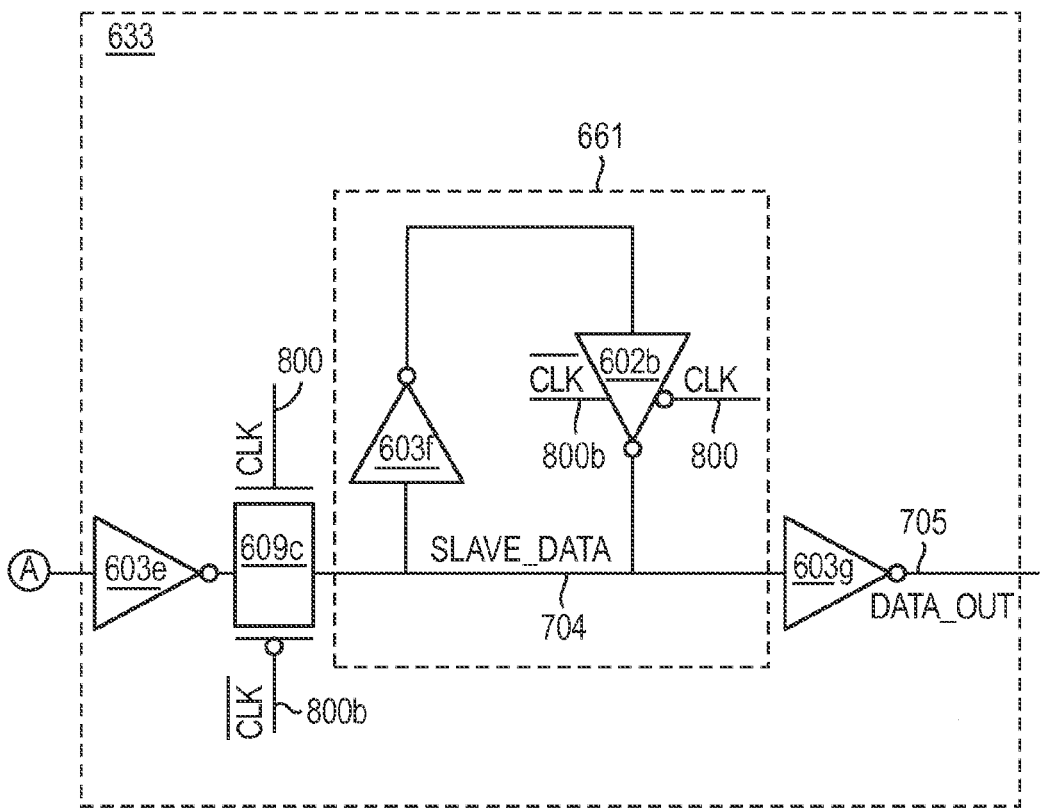

The circuit of FIG. 3 may be extended to use multiple scan legs and multiple scan inputs. FIGS. 4A-4B illustrate an embodiment employing a scannable flop 503 with multiple legs and multiple scan inputs. Similarly to FIG. 3, the flip flop of FIG. 4A includes a master latch 632 and FIG. 4B illustrates a slave latch 633. As shown in FIG. 4A, the flip flop 503 may receive multiple scan data inputs (including SCAN_DATA0 701, SCAN_DATA1 701a, ..., SCAN_DATAn 701n) each of which has its own inverted SCAN_MODE signal (including inverted SCAN_MODE0 902, inverted SCAN_MODE1 902*a*, . . . , inverted SCAN_MODEn 902*n*) which is used to select a given particular scan leg of the group of scan legs (collectively, 610, 610*a*, . . . , and 610*n*). As shown in FIG. 4A, the data leg 612 performs a logical OR (through an OR gate 608 or other digital logic means) on the scan mode input signals (collectively, SCAN_MODE0 901, SCAN_MODE1 901*a*, . . . , SCAN_MODEn 901*n*). Also in FIG. 4A, the data leg 612 generates an SCLK that is input to the master storage element 652, by performing a logical AND 620 that takes as inputs the inverted CLK 800*b* and the output of the logical OR of the scan mode input signals (collectively, SCAN_MODE0 901, SCAN_MODE1 901*a*, . . . , SCAN_MODEn 901*n*).

Note that one of ordinary skill in the art appreciates that inverters, inverted inputs/output, and other circuit elements, may be added or removed from the circuits described herein, in order to modify the circuit functionality (data, clocks, or other circuitry) as needed for a given application. Therefore, the present invention is not limited to the exact circuits shown herein and may be extended, while still relying upon the concepts of the present invention.

The present invention may be applied to any type of circuit, including, but not limited to, electronic circuits, semiconductors, integrated circuits, Very Large Scale Integrated Circuits (VLSICs), Application Specific Integrated Circuits (ASICs), circuitry on printed circuit boards (PCBs), nanotechnology circuits, and other types of circuits.

While this invention has been particularly shown and described with references to example embodiments thereof, it will be understood by those skilled in the art that various changes in form and details may be made therein without departing from the scope of the invention encompassed by the appended claims.

What is claimed is:

1. A flip flop circuit comprising:
 a master latch comprising a storage element, at least two legs including a data leg and at least one scan leg, a first node of the storage element being driven by the data leg, an opposite node of the storage element being driven by the at least one scan leg; and
 a slave latch coupled to the master latch,
 wherein the flip flop circuit has a single clock input and each leg receives the single clock input, and the at least one scan leg comprises a plurality of scan legs and the data leg performs a logical OR on a plurality of scan mode inputs.

2. The flip flop circuit of claim 1, wherein a slave data input of the slave latch is connected to the first node of the storage element.

3. The flip flop circuit of claim 1, wherein each leg has a data input that drives an inverter buffer, an output of the inverter buffer driving a transmission gate, an output of the transmission gate driving the storage element.

4. The flip flop circuit of claim 1, wherein the storage element comprises inverter buffers, where at least two of the inverter buffers oppose each other, and each inverter buffer is enabled by a respective generated clock received from each respective leg, and each inverter buffer receives data driven from each leg.

5. The flip flop circuit of claim 1, wherein the slave latch comprises a transmission gate that drives a slave storage element.

6. The flip flop circuit of claim 1, wherein the slave latch has a data input that drives an inverter buffer, an output of the inverter buffer driving a transmission gate, an output of the transmission gate driving a slave storage element, the slave storage element driving an output inverter buffer.

7. The flip flop circuit of claim 1, wherein each given leg of the at least two legs comprises a corresponding combinatorial logic block with a scan mode input and the single clock input, the output of the corresponding combinatorial logic block generating a clock, the generated clock enabling a given data output of the respective leg.

8. The flip flop circuit of claim 7, wherein the corresponding combinatorial logic block is a two-input NOR gate.

9. The flip flop circuit of claim 7, wherein the generated clock is inverted for an active low enable input, to enable the given data output of the respective leg.

* * * * *